United States Patent
Pizzuto

(10) Patent No.: US 7,834,725 B2
(45) Date of Patent: Nov. 16, 2010

(54) MAGNETIC ACTIVATION AND DEACTIVATION CIRCUIT AND SYSTEM

(75) Inventor: Charles M. Pizzuto, Buffalo, NY (US)

(73) Assignee: The SmartPill Corporation, Buffalo, NY (US)

( * ) Notice: Subject to any disclaimer, the term of this patent is extended or adjusted under 35 U.S.C. 154(b) by 291 days.

(21) Appl. No.: 11/899,316

(22) Filed: Sep. 5, 2007

(65) Prior Publication Data

US 2009/0058575 A1 Mar. 5, 2009

(51) Int. Cl.
*H01H 9/00* (2006.01)

(52) U.S. Cl. .............................. 335/205; 335/170

(58) Field of Classification Search ......... 335/151–514; 600/101, 118, 302; 324/251
See application file for complete search history.

(56) References Cited

U.S. PATENT DOCUMENTS

| | | | |
|---|---|---|---|
| 4,293,814 A | | 10/1981 | Boyer |
| 4,465,976 A | | 8/1984 | Avery et al. |
| 4,987,512 A | | 1/1991 | Mulshine |
| 5,017,804 A | | 5/1991 | Harnden et al. |
| 5,399,965 A | | 3/1995 | Heberle |
| 5,450,000 A | * | 9/1995 | Olsen ........................ 323/222 |
| 5,491,412 A | * | 2/1996 | Foster ........................ 324/251 |
| 5,560,255 A | * | 10/1996 | Willford et al. .......... 74/473.24 |
| 6,083,246 A | | 7/2000 | Stendahl et al. |
| 6,273,904 B1 | | 8/2001 | Chen et al. |
| 7,112,752 B1 | | 9/2006 | Wenner |
| 7,236,072 B2 | | 6/2007 | Grigorov |
| 7,295,226 B1 | | 11/2007 | Meron et al. |
| 2006/0190060 A1 | | 8/2006 | Greeninger et al. |
| 2006/0217792 A1 | | 9/2006 | Hussein et al. |
| 2006/0258901 A1 | * | 11/2006 | Fujimori et al. ............. 600/101 |
| 2007/0171012 A1 | | 7/2007 | Fujimori et al. |
| 2009/0192353 A1 | * | 7/2009 | Segawa ..................... 600/118 |

\* cited by examiner

*Primary Examiner*—Elvin G Enad
*Assistant Examiner*—Bernard Rojas
(74) *Attorney, Agent, or Firm*—Phillips Lytle LLP

(57) ABSTRACT

A circuit (10) comprising a latching device (20) operatively arranged to change from a first output state to a second output state as a function of a magnetic field (40) applied in a first direction, to maintain the second output state when the magnetic field is either no longer applied in the first direction or applied again in the first direction, and to change from the second output state to the first output state as a function of a magnetic field applied in a second direction, a power switching device (30) coupled to a power source (15), a load (35) and the latching device and operatively arranged such that the power switching device connects the power source and the load when the latching device is in the second state and disconnects the power source and the load when the latching device is in the first state, a magnetic switching device (25) coupled between the latching device and the power source and having an open default disconnected state and operatively arranged to change from the open default state to a closed connected state when the magnetic field is applied in the first direction and to return to the open default state when the magnetic field is removed, the latching device and magnetic switching device arranged such that the magnetic field applied in the first direction causes the magnetic switching device to change from the open default state to the closed connected state, thereby powering the latching device, and the latching device to change from the first state to the second state, thereby signaling the power switching device to connect the power source and the load.

18 Claims, 2 Drawing Sheets

MAGNETIC ACTIVATION AND DEACTIVATION CIRCUIT AND SYSTEM

TECHNICAL FIELD

The present invention relates generally to circuits, and more particularly to a circuit and system for controlling the activation and deactivation of electronics.

BACKGROUND ART

Ingestible capsules are well-known in the prior art. Such capsules are generally small pill-like devices that can be ingested or swallowed by a patient. It is known that such capsules may include one or more sensors for determining physiological data. It is further known that these sensors may be powered by batteries contained within the body of the capsule. The batteries used in such capsules need to be activated shortly before they are used in order to maximize battery lifetime.

A number of methods for controlling the activation and deactivation of the electronics in an ingestible capsule are known in the prior art. However, each of these methods has significant drawbacks regarding its performance. One such method uses an "active" reed switch system. In this system, an external magnetic field actively holds a reed switch so that the circuit remains open. When the ingestible capsule is removed from the magnetic field, the reed switch closes the circuit thereby activating the capsule. One major drawback of this design is its inability to turn off the capsule once it has been activated without having two magnets, internal and external, maintained in alignment.

Another method uses a passive reed switch and magnetizable bias magnet asymmetric design manipulated by an external magnet. The circuitry of the capsule can be selectively switched on and off depending on the magnetic state of the bias magnet which determines the reed switch on/off state. This design, however, suffers from a high failure rate when attempting to deactivate the capsule, also leading to a large number of wasted capsules.

Another method uses materials which dissolve under specific pH conditions, such as the low pH of the stomach. Once the capsule reaches an area of the gastrointestinal tract with the proper pH for dissolving the material, the previously open circuit is able to close, thus activating the capsule electronics. This system, however, has numerous disadvantages, including the inability to determine whether the activation components and capsule are functional before ingestion, the inability to calibrate the capsule sensors prior to ingestion, and the inability to acquire data for portions of the GI tract before the capsule enters a specific pH domain.

Other systems use external triggers which are sent through body tissue to activate the capsule once it has been ingested. Examples of these triggers are RF bursts, magnetic fields, or light. However, these systems suffer the same drawbacks as the pH dissolving activation capsules.

Thus, there is a need for a reliable method for the activation and deactivation of an ingestible capsule.

DISCLOSURE OF THE INVENTION

With parenthetical reference to corresponding parts, portions, or surfaces of the disclosed embodiment, merely for purposes of illustration and not by any way of limitation, the present invention provides an improved circuit (10) comprising a magnetically sensitive latching device (20) operatively configured and arranged to change from a first output state to a second output state as a function of a magnetic field (40) applied in a first direction, to maintain the second output state when the magnetic field is no longer applied in the first direction, and to change from the second output state to the first output state as a function of a magnetic field applied in a second direction, a power switching device (30) coupled to a power source (15) and a load (35), the power switching device coupled to the latching device and the latching device and the power switching device operatively configured and arranged such that the power switching device connects the power source and the load when the latching device is in the first state and disconnects the power source and the load when the latching device is in the second state, the latching device coupled to the power source between the power source and the power switching device, a magnetic switching device (25) between the latching device and the power source, the magnetic switching device having an open disconnected default state and operatively configured and arranged to change from the open default state to a closed connected state while the magnetic field is applied in the first direction and to return to the open default state when the magnetic field is removed, the latching device and the magnetic switching device spacially aligned such that the magnetic field applied in the first direction causes the magnetic switching device to change from the open default state to the closed connected state, thereby powering the latching device, and the latching device to change from the first state to the second state, thereby signaling the power switching device to connect the power source and the load.

The power switching device may be a field-effect transistor (FET) conductive in the first state and non-conductive in the second state. The latching device may be a Hall-Effect latch. The magnetic switching device may be a reed switch. The circuit may further comprise a capsule containing the power source and the load, the load may be electronics in an ingestible capsule, and the power source may be a battery in an ingestible capsule. The magnetic switching device may change from the open default state to a closed connected state when the magnetic field is applied in either direction. The latching device may be operatively configured and arranged to maintain the first output state when the magnetic field is no longer applied in the first direction. The latching device may be further coupled to the power source between the power switching device and the load.

The circuit may further comprise a second power switching device (33) coupled to the power source and the latching device (20), a processor (27) coupled to the second power switching device and the latching device, the processor and the second switching device configured and arranged such that the processor is programmed to direct the second switching device to connect the power source and the latching device and to disconnect the power source and the latching device. The second power switching device may be a field-effect transistor conductive in a first state and non-conductive in a second state and the processor may communicate with the second power switching device to switch the second switching device between the conductive state and the non-conductive state in order to control power supplied to the latching device. The processor may be coupled to the power switching device and programmed to sense a first input signal state (3HI) from the latching device, provide an enable signal (1) to the power switching device (30) as a function of the first input signal, and to maintain the enable signal when the first input signal ceases. The processor may be programmed to sense a second input signal state (3LO) from the latching device and to cease the enable signal to the power switching device as a function of the second input signal. The power switching device may be a field-effect transistor conductive when the processor provides the enable signal and non-conductive when the processor does not provide the enable signal. The processor may be further coupled to the battery between the power switching device and the load.

Accordingly, the general object is to provide a device and method for activation and deactivation of an ingestible capsule or other electronics.

These and other objects and advantages will become apparent from the foregoing and ongoing written specification, the drawings, and the claims.

DESCRIPTION OF PREFERRED EMBODIMENTS

Figure 1:
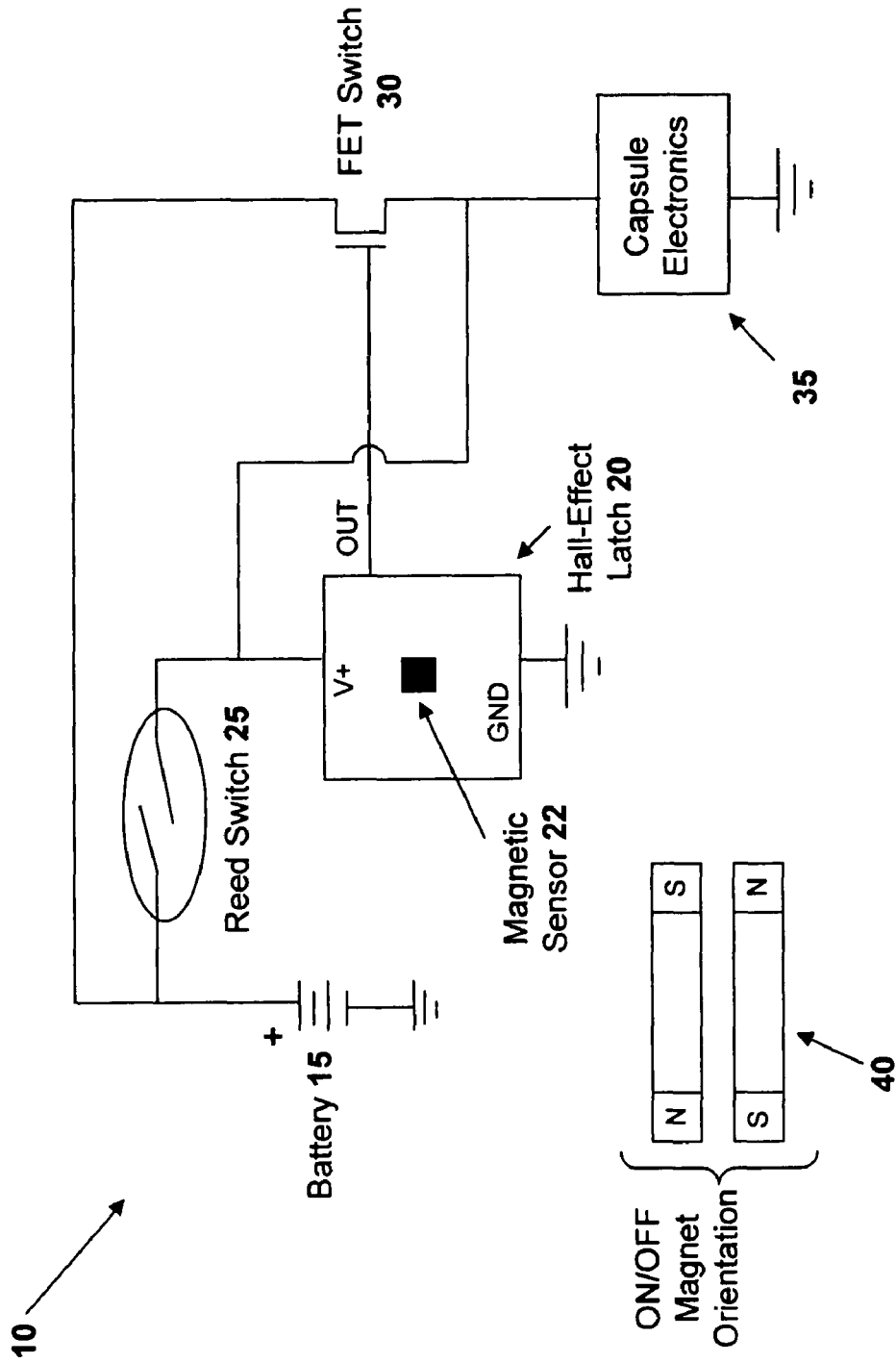
FIG. 1 is a schematic of the preferred embodiment of the circuit.

At the outset, it should be clearly understood that like reference numerals are intended to identify the same structural elements, portions or surfaces, consistently throughout the several drawing figures, as such elements, portions or surfaces may be further described or explained by the entire written specification, of which this detailed description is an integral part. Unless otherwise indicated, the drawings are intended to be read (e.g., cross-hatching, arrangement of parts, proportion, degree, etc.) together with the specification, and are to be considered a portion of the entire written description of this invention. As used in the following description, the terms "horizontal", "vertical", "left", "right", "up" and "down", as well as adjectival and adverbial derivatives thereof (e.g., "horizontally", "rightwardly", "upwardly", etc.), simply refer to the orientation of the illustrated structure as the particular drawing figure faces the reader. Similarly, the terms "inwardly" and "outwardly" generally refer to the orientation of a surface relative to its axis of elongation, or axis of rotation, as appropriate.

Referring now to the drawings and, more particularly, to FIG. 1 thereof, this invention provides a new and improved activation and deactivation circuit, of which the presently preferred embodiment is generally indicated at 10. In the preferred embodiment, a battery powered ingestible capsule is provided with a circuit 10 for selectively powering ON and OFF the electronic components of the capsule. As shown in FIG. 1, circuit 10 operates between a battery 15 and capsule electronics 35 and generally includes a gate element 25, a latch 20 and a gate element 30.

Latch 20 is a Hall-Effect latch and is typically a few millimeters square and contains a magnetic sensor 22 which responds selectively to the presence and polarity of a magnetic field, such as that produced by magnet 40. In the preferred embodiment, magnet 40 is a low-cost permanent magnet having North and South poles. When exposed to magnetic flux above its threshold in one direction, latch 20 will set its output terminal to a pre-determined logic state. When the magnetic field is removed from the latch's vicinity, the latch will maintain that same pre-determined logic state. When exposed to magnetic flux of sufficient intensity in the opposite direction, the latch will set its output terminal to the opposite logic state. When the magnetic field is removed from the latch's vicinity, the latch will maintain this opposite logic state. In effect, the latch "remembers" and maintains the logic state corresponding to the last magnetic field which exceeded its threshold level in either direction.

Latch 20's output is applied to gating element or switch 30, which is coupled to and between battery 15 and electronics 35. In the preferred embodiment, gate 30 is a p-channel Field-Effect Transistor (FET) switch, which has the function of assuming a non-conductive or conductive state, depending on latch 20's output state, HI or LO. The FET's gate receives latch 20 output and controls the FET's ON/OFF state, conducting and non-conducting, respectively.

In the preferred embodiment, low parasitic drain of battery 15 is provided by selection of an FET switch 30 with very low leakage when in the power OFF state (which encompasses times when the capsule is in storage or before use in a medical diagnostic procedure). The leakage should be sufficiently small to permit acceptably low battery consumption over the expected maximum capsule storage time in the power OFF state.

Further, the current consumption of circuit 10 when the capsule is ON should be small relative to the capsule's normal average operating current so as not to appreciably shorten the capsule's total operating time. The current consumption of circuit 10 is determined primarily by the current requirement of Hall-Effect latch 20 when it is active. Substantial power savings may be provided by incorporating an on-chip power management scheme whereby the latch 20, using internal control circuitry, places itself in a low-power condition and only periodically powers-on, to sense and sample the magnetic field status and to set the output state, and then powers-down. This is performed at a very low duty cycle, resulting in a correspondingly low average current drain.

In addition, to limit latch 20's current drain, in the preferred embodiment latch 20 is powered from the switched side of FET 30, as shown in FIG. 1. However, as shown in FIG. 1, FET 30 depends on latch 20 for its power ON control and latch 20 depends upon FET 30 for its power source. Therefore, second gating element or switch 25 is provided between battery 15 and latch 20. In the preferred embodiment, switch 25 is a reed switch that momentarily provides power to latch 20 when a magnetic field is applied. Reed switch 25 turns ON in the presence of a sufficiently strong magnetic field of either direction provided by magnet 40. Once latch 20 powers ON and detects the magnetic field using magnetic sensor 22, latch 20 sets its output to the state corresponding to power ON, thereby setting FET 30 to its conducting state. The magnetic field supplied by magnet 40 can be removed and power to latch 20 and the capsule electronics 35 will be maintained.

Similarly, when the opposite magnetic flux direction is applied, latch 20 sets to the power OFF state, which switches FET 30 to its non-conducting state, thereby removing its power connection to latch 20. Latch 20 and the capsule will continue to receive power from the momentary closure of reed switch 25 until the magnetic field of magnet 40 is removed. In this fashion, one need merely apply the appropriately directed magnetic field momentarily in order to force the capsule power ON, and the capsule will remain powered ON. Similarly, one needs to momentarily apply the oppositely directed magnetic field in order to force capsule power OFF, and it will remain OFF. Latch 20's sample rate for magnetic sensing is sufficiently fast to "capture" the magnetic field's presence. Typical rates in the sub 20 millisecond order of magnitude accomplish this effectively in terms of human action and response times.

System 10 will operate with relatively low magnetic field levels, does not depend upon any installed external or internal bias magnets (permanent or "magnetizable"), requires only acceptably low battery consumption, is low in cost, and performs with the proven reliability of Hall-Effect devices.

It is contemplated that circuit 10 could be configured to function without reed switch 25. This circuit, while functional, would drain power from battery 15. However, if one had unlimited power or abundant battery lifetime, this circuit would also selectively activate and deactivate electronic components.

Figure 2:
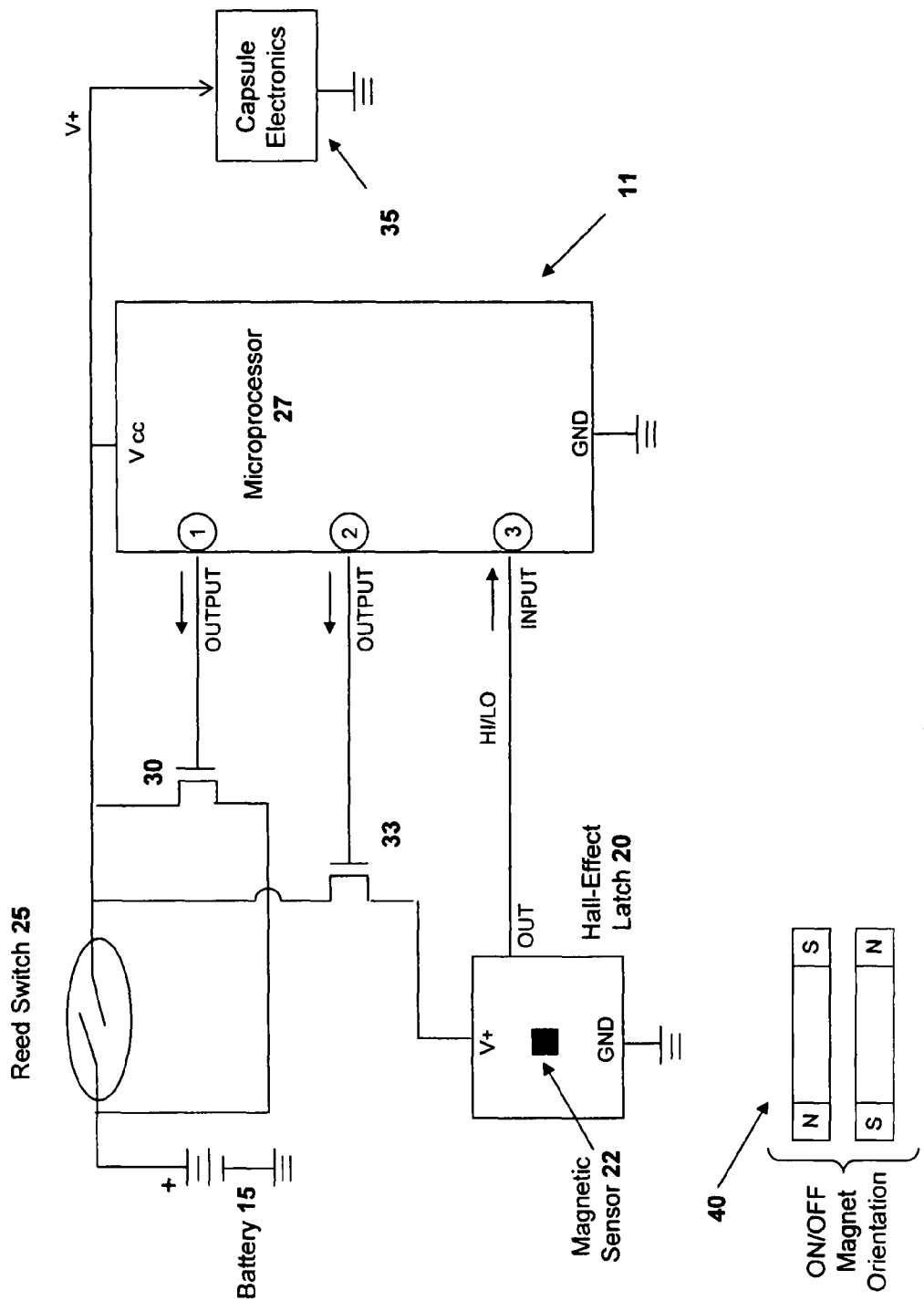
FIG. 2 is a schematic of an alternative embodiment of the circuit.

FIG. 2 illustrates an alternative embodiment 11. This embodiment also operates between battery 15 and capsule electronics 35, and generally includes a reed switch 25, a Hall-Effect latch 20 (with magnetic sensor 22), a FET switch 30, a microprocessor 27, and a second FET switch 33. Hall-Effect latch 20 utilizes microprocessor 27 for its own power management. In this configuration, power to both microprocessor 27 and capsule electronics 35 is switched or gated by p-channel FET 30. Power to Hall-Effect latch 20 is switched or gated by p-channel FET 33. Reed switch 25 is utilized to momentarily apply power to microprocessor 27 in order to start the power ON sequence and also provides isolation from leakage currents when the capsule is OFF.

For the power ON operation, permanent magnet 40 is brought into the vicinity of reed switch 25 and the Hall-Effect latch 20, which houses magnetic sensor 22. Reed switch 25 then closes and applies power to microprocessor 27 and other capsule electronics 35. Latch 20 does not respond to the magnet's field since FET 33 is initially forced in the OFF state and no power is available to latch 20. As soon as microprocessor 27 starts to execute its program, it gates OUTPUT 2 to the LO state, which forces FET 33 ON, thereby applying power to latch 20. During the gate time, latch 20 will sense the magnetic field and set its output signal (HI or LO) according to the field's direction (ON orientation, initially). The latch output is routed to INPUT 3, which microprocessor 27 reads to determine the magnetic field orientation. Since it is oriented ON, microprocessor 27 then sets OUTPUT 1 to the LO state, thereby forcing FET 30 ON and providing a power conduction path around reed switch 25. At this point, capsule power is maintained in the ON condition, and magnet 40 can be drawn away from the capsule. Although reed switch 25 will now open, microprocessor 27 and FET 30 will maintain the power ON connection. Microprocessor 27 will then periodically gate OUTPUT 2 to turn switch 33 from a non-conductive to a conductive state and then sense the magnetic field via powered-enabled latch 20 by reading INPUT 3. With no field present, latch 20 maintains its previous state, no change is made to OUTPUT 1, and consequently no change occurs to the capsule electronics' power state. However, should INPUT 3 detect a reversal in magnetic field (to cause the capsule to power OFF), processor 27 will set OUTPUT 1 so as to cause FET 30 to turn OFF. Turning FET 30 OFF breaks the connection between battery 15, capsule electronics 35 and microprocessor 27. However, the capsule will not power OFF until magnet 40 is withdrawn, which opens reed switch 25, completely disconnecting power from battery 15. Thus, the circuit configuration of this second embodiment will respond in a similar manner to magnet 40 as does the circuit configuration of the first preferred embodiment.

The present invention contemplates that changes and modifications may be made. Therefore, while the presently-preferred form of the system has been shown and described, and at least one modification discussed, persons skilled in this art will readily appreciate that various additional changes and modifications may be made without departing from the spirit of the invention, as defined and differentiated by the following claims.

What is claimed is:

1. A circuit comprising:
   a magnetically sensitive latching device operatively configured and arranged to change from a first output state to a second output state as a function of a magnetic field applied in a first direction, to maintain said second output state when said magnetic field is either no longer applied in said first direction or applied again in said first direction, and to change from said second output state to said first output state as a function of a magnetic field applied in a second direction different from said first direction;
   a power switching device coupled between a power source and a load;
   said power switching device coupled to said magnetically sensitive latching device;
   said magnetically sensitive latching device and said power switching device operatively configured and arranged such that said power switching device connects said power source and said load when said magnetically sensitive latching device is in said second state and disconnects said power source and said load when said magnetically sensitive latching device is in said first state;
   said magnetically sensitive latching device coupled to said power source;
   a magnetic switching device coupled between said magnetically sensitive latching device and said power source;
   said magnetic switching device having an open disconnected default state and operatively configured and arranged to change from said open default state to a closed connected state when said magnetic field is applied in said first direction and to return to said open default state when said magnetic field is removed;
   said power source, said magnetically sensitive latching device and said magnetic switching device arranged such that said magnetic field applied in said first direction causes said magnetic switching device to change from said open default state to said closed connected state, thereby powering said magnetically sensitive latching device, and said magnetically sensitive latching device to change from said first state to said second state, thereby signaling said power switching device to connect said power source and said load.

2. The circuit set forth in claim 1, wherein said power switching device is a field-effect transistor conductive when said magnetically sensitive latching device is in said second state and non-conductive when said magnetically sensitive latching device is in said first state.

3. The circuit set forth in claim 1, wherein said magnetically sensitive latching device is a Hall-Effect latch.

4. The circuit set forth in claim 1, wherein said magnetic switching device is a reed switch.

5. The circuit set forth in claim 1, and further comprising a capsule containing said power source and said load.

6. The circuit set forth in claim 1, wherein said load comprises electronics in an ingestible capsule.

7. The circuit set forth in claim 1, wherein said power source comprises a battery in an ingestible capsule.

8. The circuit set forth in claim 1, wherein said magnetic switching device is adapted to change from said open default state to said closed connected state when said magnetic field is applied in said second direction.

9. The circuit set forth in claim 1, wherein said magnetically sensitive latching device is operatively configured and arranged to maintain said first output state when said magnetic field is no longer applied in said second direction.

10. The circuit set forth in claim 1, wherein said magnetically sensitive latching device is coupled to said power source with a connection point between said power source and said power switching device and is further coupled to said power source with a connection point between said power switching device and said load.

11. The circuit set forth in claim 1, and further comprising a processor coupled with said latching device and programmed and configured to manage power to said latching device.

12. The circuit set forth in claim 1, and further comprising:
a second power switching device coupled to said power source and said latching device;
a processor coupled to said second power switching device and said latching device;
said processor and said second switching device configured and arranged such that said processor is programmed to direct said second switching device to connect said power source and said latching device and to disconnect said power source and said latching device.

13. The circuit set forth in claim 12, wherein said second power switching device is a field-effect transistor conductive in a first state and non-conductive in a second state.

14. The circuit set forth in claim 13, wherein said processor communicates with said second power switching device to switch said second switching device between said conductive state and said non-conductive state in order to control power to said latching device.

15. The circuit set forth in claim 12, wherein said processor is coupled to said power switching device and is programmed to:
sense a first input signal from said latching device;
provide an enable signal to said power switching device as a function of said first input signal; and
to maintain said enable signal when said first input signal ceases.

16. The circuit set forth in claim 15, wherein said processor is programmed to sense a second input signal from said latching device and to cease said enable signal to said power switching device as a function of said second input signal.

17. The circuit set forth in claim 16, wherein said power switching device is a field-effect transistor conductive when said processor provides said enable signal and non-conductive when said processor does not provide said enable signal.

18. The circuit set forth in claim 12, wherein said processor is coupled to said battery between said power switching device and said load.

* * * * *